(12) United States Patent
Golda et al.

(10) Patent No.: US 9,236,815 B2
(45) Date of Patent: Jan. 12, 2016

(54) COMPLIANT MICRO DEVICE TRANSFER HEAD ARRAY WITH METAL ELECTRODES

(71) Applicant: LuxVue Technology Corporation, Santa Clara, CA (US)

(72) Inventors: Dariusz Golda, Redwood City, CA (US); Andreas Bibl, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 312 days.

(21) Appl. No.: 13/710,442

(22) Filed: Dec. 10, 2012

(65) Prior Publication Data

US 2014/0159324 A1 Jun. 12, 2014

(51) Int. Cl.
*H02N 13/00* (2006.01)
*B81C 99/00* (2010.01)

(52) U.S. Cl.
CPC .............. *H02N 13/00* (2013.01); *B81C 99/002* (2013.01); *Y10T 279/23* (2015.01)

(58) Field of Classification Search
CPC ................. H02N 13/00; B23Q 3/15
USPC ...................... 29/740, 729, 739, 744; 279/128
See application file for complete search history.

(56) References Cited

U.S. PATENT DOCUMENTS

| | | | |
|---|---|---|---|
| 4,837,176 A | 6/1989 | Zdebel et al. | |
| 5,067,002 A | 11/1991 | Zdebel et al. | |
| 5,110,752 A | 5/1992 | Lu | |
| 5,266,514 A | 11/1993 | Tuan et al. | |
| 5,426,558 A * | 6/1995 | Sherman ............ | H01L 21/6831 269/8 |
| 5,493,470 A | 2/1996 | Zavracky et al. | |
| 5,592,358 A * | 1/1997 | Shamouilian ....... | H01L 21/6831 361/234 |
| 5,640,133 A | 6/1997 | MacDonald et al. | |
| 5,745,331 A | 4/1998 | Shamouilian et al. | |
| 5,771,253 A | 6/1998 | Chang-Hasnain et al. | |
| 5,839,187 A | 11/1998 | Sato et al. | |
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,071,795 A | 6/2000 | Cheung et al. | |
| 6,096,368 A * | 8/2000 | Sun ...................... | B01J 19/0046 279/128 |

(Continued)

FOREIGN PATENT DOCUMENTS

| | | |
|---|---|---|
| JP | 07-060675 A | 3/1995 |
| JP | 3406207 | 5/1999 |

(Continued)

OTHER PUBLICATIONS

LuxVue Technology Corporation Notice of Allowance for U.S. Appl. No. 13/481,592 mailed Dec. 7, 2012.

(Continued)

*Primary Examiner* — Peter DungBa Vo
*Assistant Examiner* — Kaying Kue
(74) *Attorney, Agent, or Firm* — Blakely, Sokoloff, Taylor & Zafman LLP

(57) ABSTRACT

Compliant monopolar and bipolar micro device transfer head arrays and methods of formation from SOI substrates are described. In an embodiment, an array of compliant transfer heads are formed over a base substrate and deflectable toward the base substrate, and a patterned metal layer includes a metal interconnect layer electrically connected with an array of the metal electrodes in the array of compliant transfer heads.

14 Claims, 9 Drawing Sheets

(56) References Cited

U.S. PATENT DOCUMENTS

| | | | |
|---|---|---|---|
| 6,335,263 B1 | 1/2002 | Cheung et al. |
| 6,379,929 B1 | 4/2002 | Burns et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,813,291 B2 | 11/2004 | Wang et al. |
| 6,825,105 B2 | 11/2004 | Grover et al. |
| 6,878,607 B2 | 4/2005 | Inoue et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,335,527 B2 | 2/2008 | Sawyer et al. |
| 7,353,596 B2 | 4/2008 | Shida et al. |
| 7,358,158 B2 | 4/2008 | Aihara et al. |
| 7,585,703 B2 | 9/2009 | Matsumura et al. |
| 7,622,367 B1 | 11/2009 | Nuzzo et al. |
| 7,723,764 B2 | 5/2010 | Oohata et al. |
| 7,785,481 B2 | 8/2010 | Wang |
| 7,795,629 B2 | 9/2010 | Watanabe et al. |
| 7,797,820 B2 | 9/2010 | Shida et al. |
| 7,829,366 B2 | 11/2010 | Miller et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,929,195 B2 | 4/2011 | Bifano |
| 7,943,497 B2 | 5/2011 | Nakai |
| 7,972,875 B2 | 7/2011 | Rogers et al. |
| 7,982,296 B2 | 7/2011 | Nuzzo et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,333,860 B1 | 12/2012 | Bibl et al. |
| 8,349,116 B1 | 1/2013 | Bibl et al. |
| 8,383,506 B1* | 2/2013 | Golda ............... B81C 99/002 257/623 |
| 8,415,767 B1* | 4/2013 | Golda ............... B81C 99/002 257/619 |
| 8,415,768 B1* | 4/2013 | Golda ............... H01L 23/5384 257/619 |
| 8,440,546 B2 | 5/2013 | Nuzzo et al. |
| 8,506,867 B2 | 8/2013 | Menard |
| 8,569,115 B1* | 10/2013 | Golda ............... B81C 99/002 257/619 |
| 8,664,699 B2 | 3/2014 | Nuzzo et al. |
| 8,686,542 B2* | 4/2014 | Golda ............... H01L 23/5384 257/619 |
| 8,791,530 B2* | 7/2014 | Bibl ..................... B81C 1/0015 257/414 |
| 8,865,489 B2 | 10/2014 | Rogers et al. |
| 8,877,648 B2 | 11/2014 | Bower et al. |
| 8,889,485 B2 | 11/2014 | Bower |
| 8,934,259 B2 | 1/2015 | Bower et al. |
| 2001/0029088 A1 | 10/2001 | Odajima et al. |
| 2002/0022308 A1 | 2/2002 | Ahn et al. |
| 2002/0061042 A1 | 5/2002 | Wang et al. |
| 2002/0076848 A1 | 6/2002 | Spooner et al. |
| 2002/0168671 A1 | 11/2002 | Burns et al. |
| 2002/0171518 A1 | 11/2002 | Hsu et al. |
| 2002/0172969 A1 | 11/2002 | Burns et al. |
| 2003/0010975 A1 | 1/2003 | Gibb et al. |
| 2003/0022474 A1 | 1/2003 | Grover et al. |
| 2003/0169786 A1 | 9/2003 | Kapon et al. |
| 2003/0177633 A1 | 9/2003 | Haji et al. |
| 2004/0056307 A1 | 3/2004 | Cho et al. |
| 2004/0124490 A1 | 7/2004 | Bohr et al. |
| 2004/0161943 A1 | 8/2004 | Ren et al. |
| 2004/0232439 A1 | 11/2004 | Gibb et al. |
| 2005/0210988 A1 | 9/2005 | Amano et al. |
| 2005/0232728 A1 | 10/2005 | Rice et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048520 A1* | 2/2008 | Gulvin ............... H01H 59/0009 310/309 |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0283190 A1 | 11/2008 | Papworth et al. |
| 2008/0303038 A1 | 12/2008 | Grotsch et al. |
| 2009/0068774 A1 | 3/2009 | Slater et al. |
| 2009/0090693 A1 | 4/2009 | Wang |
| 2009/0146303 A1 | 6/2009 | Kwon |
| 2009/0218642 A1 | 9/2009 | Miller et al. |
| 2009/0301176 A1 | 12/2009 | Rowe et al. |
| 2009/0303713 A1 | 12/2009 | Chang et al. |
| 2009/0314991 A1 | 12/2009 | Cho et al. |
| 2010/0039747 A1* | 2/2010 | Sansoni ............... H01L 21/6833 361/234 |
| 2010/0046134 A1 | 2/2010 | Mizuno et al. |
| 2010/0105172 A1 | 4/2010 | Li et al. |
| 2010/0142114 A1 | 6/2010 | Purohit et al. |
| 2010/0149720 A1 | 6/2010 | Fujisawa et al. |
| 2010/0188794 A1 | 7/2010 | Park et al. |
| 2010/0203659 A1 | 8/2010 | Akaike et al. |
| 2010/0203661 A1 | 8/2010 | Hodota |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0121462 A1 | 5/2011 | Kim |
| 2011/0151602 A1 | 6/2011 | Speier |
| 2011/0159615 A1 | 6/2011 | Lai |
| 2011/0210357 A1 | 9/2011 | Kaiser et al. |
| 2012/0064642 A1 | 3/2012 | Huang et al. |
| 2012/0134065 A1 | 5/2012 | Furuya et al. |
| 2013/0126891 A1 | 5/2013 | Bibl et al. |
| 2013/0285086 A1 | 10/2013 | Hu et al. |
| 2013/0316529 A1 | 11/2013 | Golda et al. |
| 2014/0373898 A1 | 12/2014 | Rogers et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-079745 A | 3/2004 |
| JP | 2004-095944 A | 3/2004 |
| JP | 2006-0148602 | 6/2006 |
| JP | 2008-200821 A | 9/2008 |
| JP | 2010-056458 A | 3/2010 |
| JP | 2010-186829 A | 8/2010 |
| KR | 10-2002-0022557 A | 3/2002 |
| KR | 10-2004-0030610 A | 4/2004 |
| KR | 10-0610632 B1 | 8/2006 |
| KR | 10-2007-0042214 A | 4/2007 |
| KR | 10-2007-0093091 A | 9/2007 |
| KR | 10-0800825 B1 | 1/2008 |
| KR | 10-0973928 B1 | 8/2010 |
| KR | 10-1001454 B1 | 12/2010 |
| KR | 10-2007-0006885 A | 1/2011 |
| KR | 10-2011-0075451 A | 7/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

(56) References Cited

OTHER PUBLICATIONS

LuxVue Technology Corporation Office Action for U.S. Appl. No. 13/481,592 mailed Aug. 15, 2012.
LuxVue Technology Corporation Office Action for U.S. Appl. No. 13/543,675 mailed Sep. 24, 2012.
LuxVue Technology Corporation Office Action for U.S. Appl. No. 13/543,684 mailed Sep. 24, 2012.
LuxVue Technology Corporation Notice of Allowance for U.S. Appl. No. 13/543,690 mailed Oct. 22, 2012.
LuxVue Technology Corporation Notice of Allowance for U.S. Appl. No. 13/543,675 mailed Jan. 8, 2013.
LuxVue Technology Corporation Notice of Allowance for U.S. Appl. No. 13/543,684 mailed Jan. 11, 2013.
LuxVue Technology Corporation Notice of Allowance for U.S. Appl. No. 13/543,680 mailed Sep. 16, 2013.
LuxVue Technology Corporation Office Action for U.S. Appl. No. 13/828,117 mailed Sep. 11, 2013.
LuxVue Technology Corporation Office Action for U.S. Appl. No. 13/481,615 mailed Aug. 20, 2014.
LuxVue Technology Corporation Notice of Allowance for U.S. Appl. No. 14/063,963 mailed Jan. 2, 2014.
LuxVue Technology Corporation Office Action for U.S. Appl. No. 14/221,071 mailed Aug. 20, 2014.
LuxVue Technology Corporation Notice of Allowance for U.S. Appl. No. 13/828,117 mailed Nov. 7, 2013.
LuxVue Technology Corporation Notice of Allowance for U.S. Appl. No. 14/173,693 mailed Nov. 28, 2014.
Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
Bower, C.A., et al., "Active-Matrix OLED Display Backplanes Using Transfer-Printed Microscale Integrated Circuits", IEEE, 2010 Electronic Components and Technology Conference, pp. 1339-1343.
"Characteristics of electrostatic Chuck(ESC)" Advanced Materials Research Group, New Technology Research Laboretory, 2000, pp. 51-53 accessed at http://www.socnb.com/report/ptech_e/2000p51_e.pdf.
Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Medtronic Energy and Components Center, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.
LuxVue Technology Corporation Notice of Allowance for U.S. Appl. No. 13/481,615 mailed Jan. 20, 2015.
LuxVue Technology Corporation Office Action for U.S. Appl. No. 14/173,693 mailed Aug. 11, 2014.
LuxVue Technology Corporation Notice of Allowance for U.S. Appl. No. 14/221,071 mailed Feb. 9, 2015.

* cited by examiner

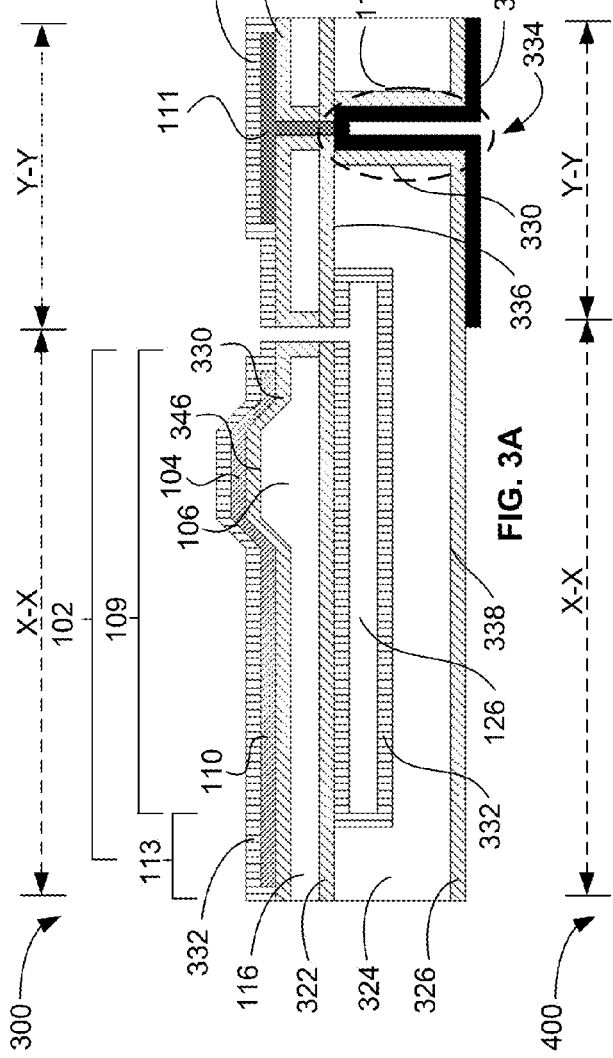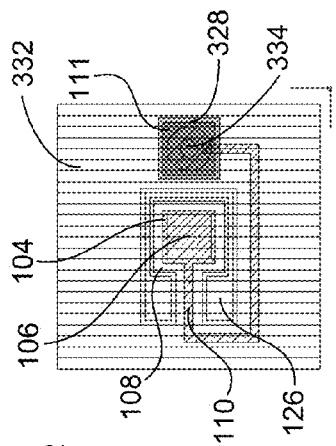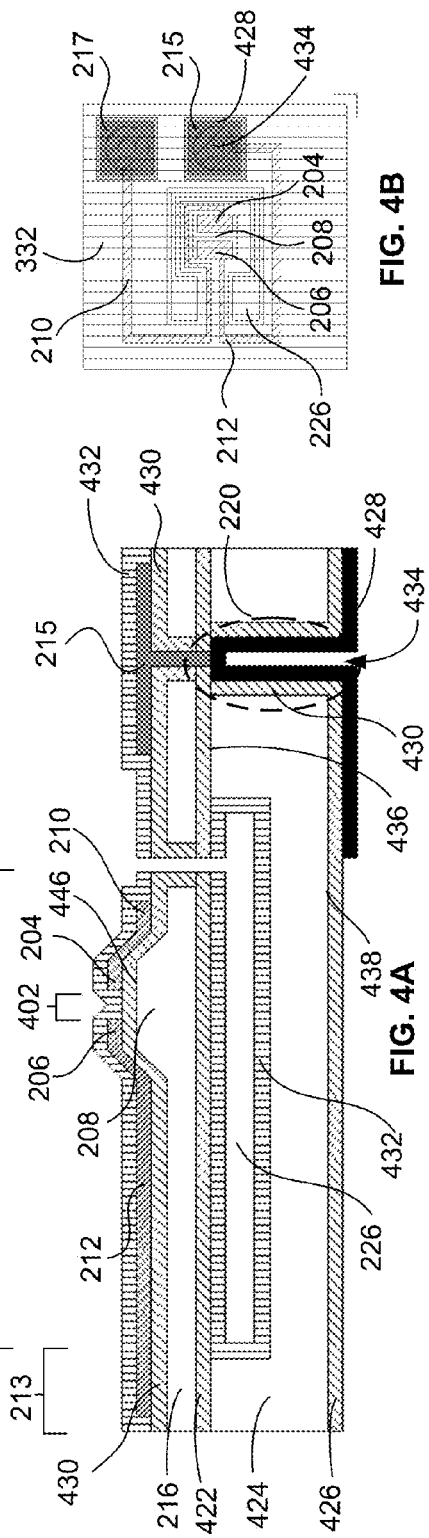

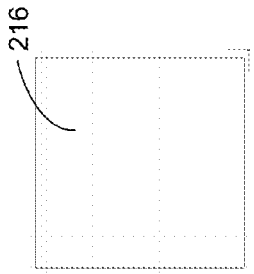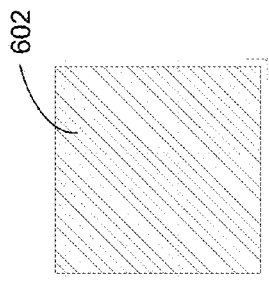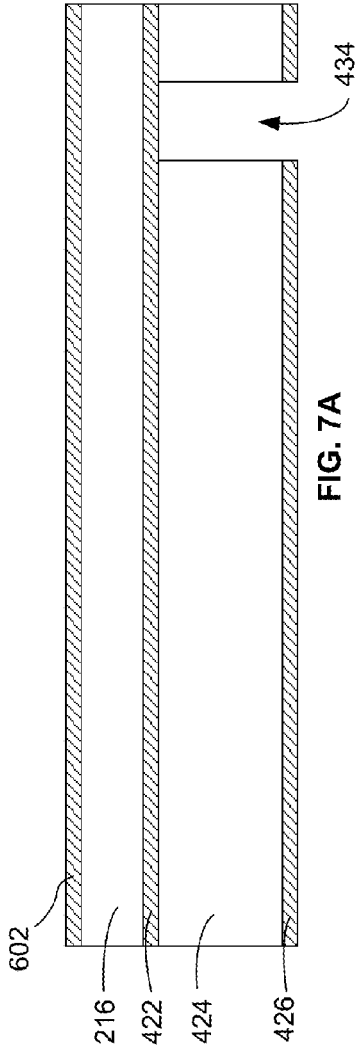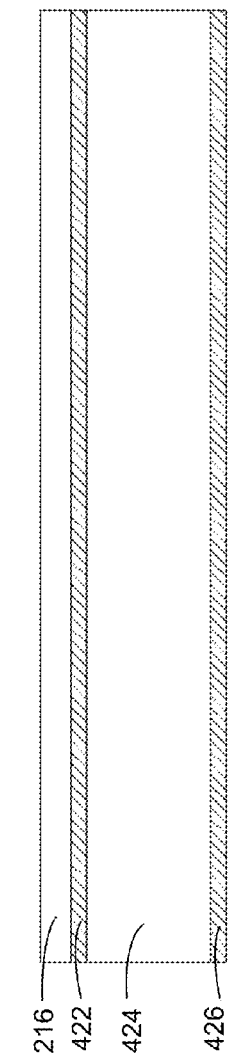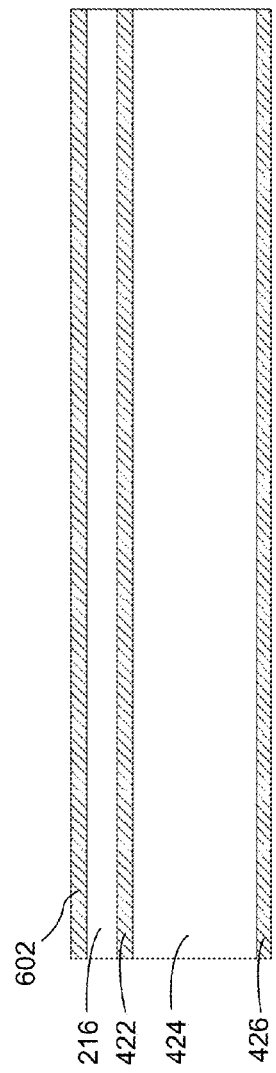

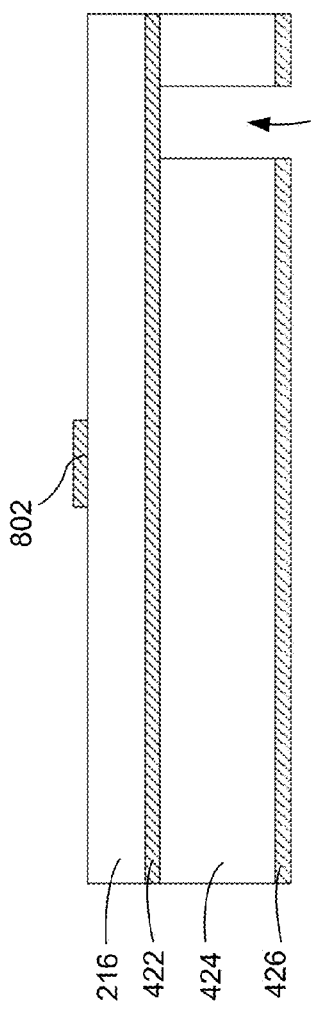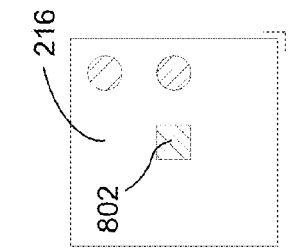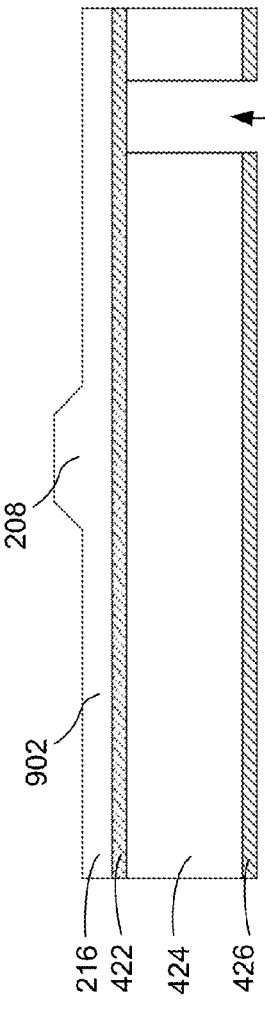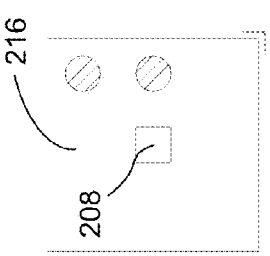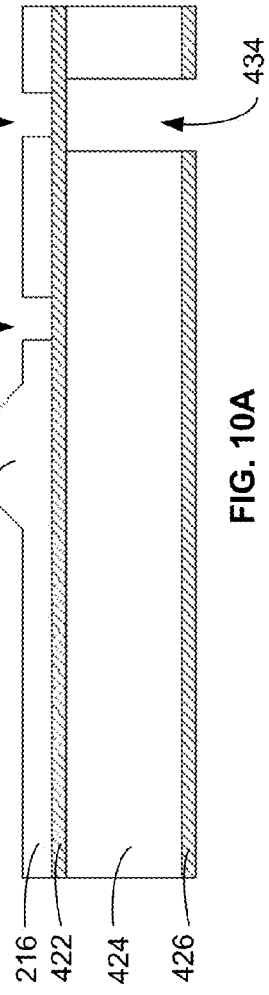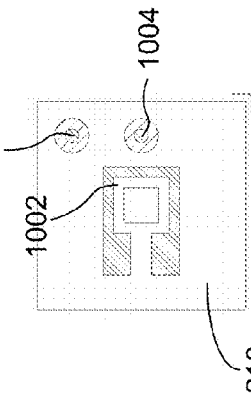

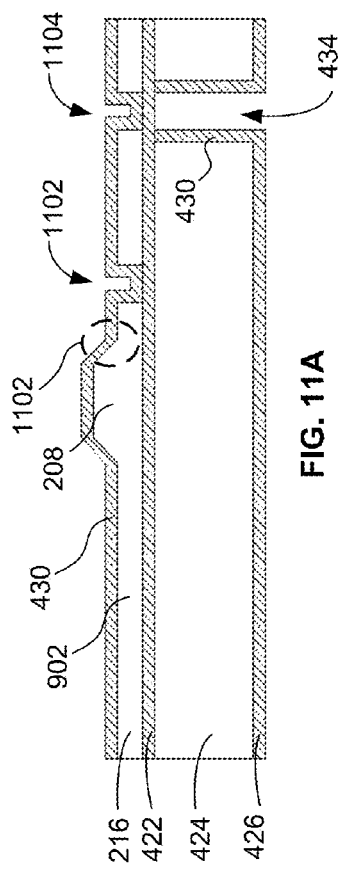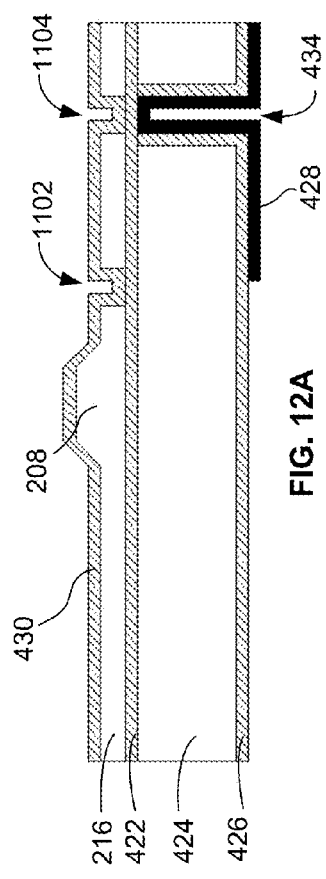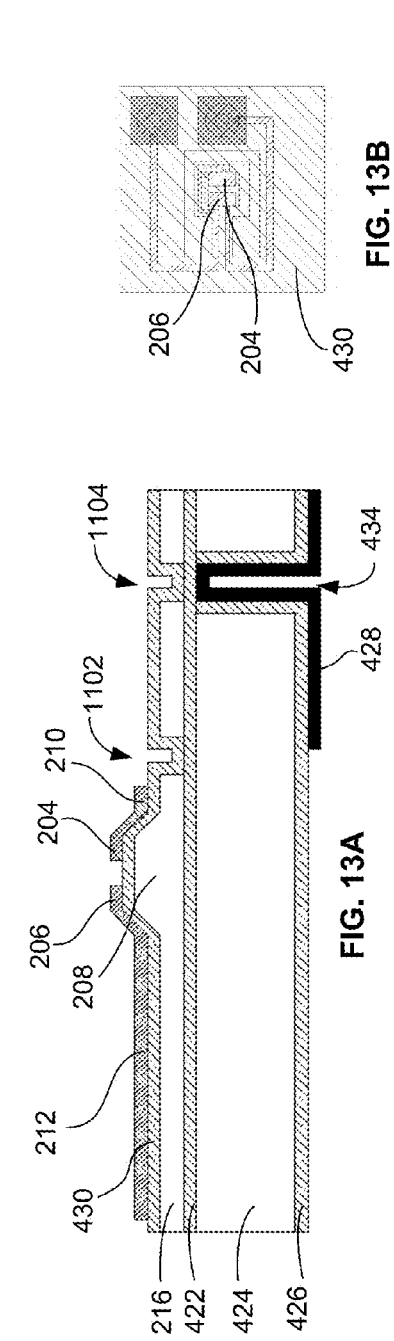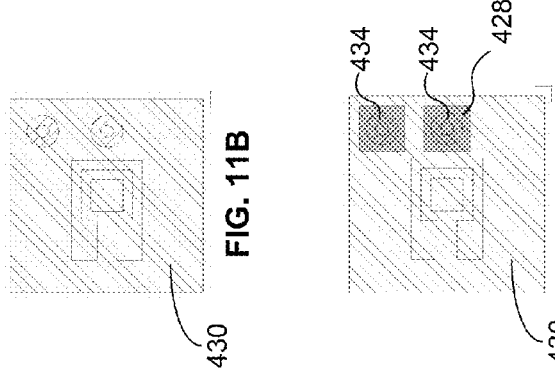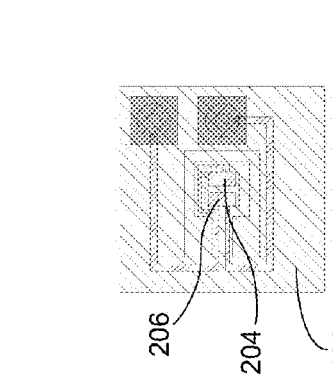

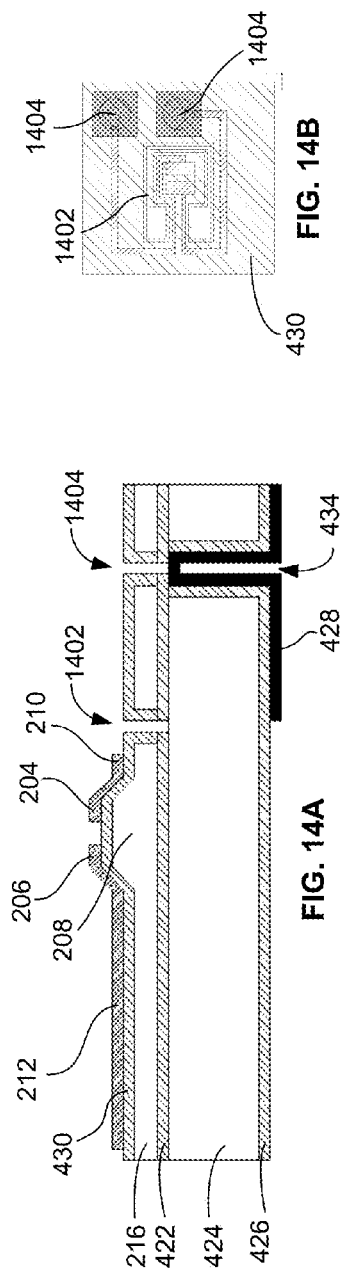
FIG. 14A
FIG. 14B
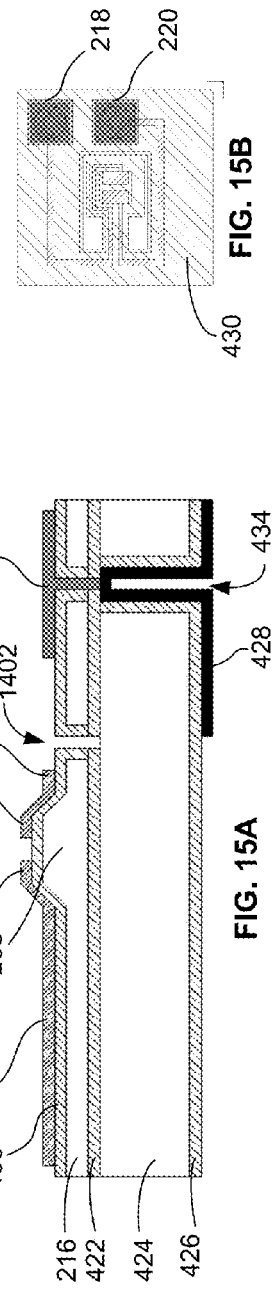
FIG. 15A
FIG. 15B
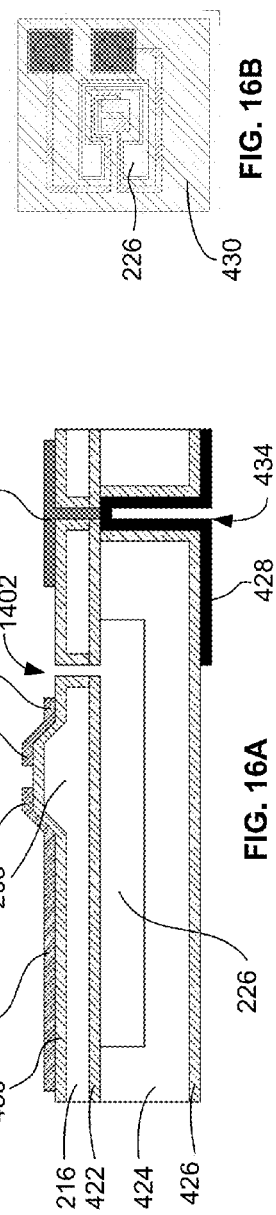
FIG. 16A
FIG. 16B

COMPLIANT MICRO DEVICE TRANSFER HEAD ARRAY WITH METAL ELECTRODES

BACKGROUND

1. Field

The present invention relates to micro devices. More particularly embodiments of the present invention relate to a compliant micro device transfer head with metal electrodes and a method of transferring one or more micro devices to a receiving substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/de-bonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and de-bonded during the transfer process. In both traditional and variations of the direct printing and transfer printing technologies, the transfer wafer is de-bonded from a device after bonding the device to the receiving wafer. In addition, the entire transfer wafer with the array of devices is involved in the transfer process.

SUMMARY OF THE INVENTION

Compliant monopolar and bipolar micro device transfer head arrays with metal electrodes, and methods of transferring an array of micro devices are disclosed. In an embodiment, the compliant micro device transfer head arrays may be formed from a silicon-on-insulator (SOI) substrate.

In one implementation compliant monopolar micro device transfer head arrays are described. In an embodiment, a compliant micro device transfer head array includes a base substrate and an array of compliant transfer heads formed over the base substrate and deflectable toward the base substrate. Each compliant transfer head may include a lower insulating layer, a spring layer over the lower insulating layer where the spring layer includes a mesa structure protruding from a spring arm, an upper insulating layer over the spring layer, a metal electrode over the upper insulating layer and the mesa structure, and a dielectric layer covering the metal electrode over the mesa structure. In an embodiment, the dielectric layer is formed of a high-k dielectric material such as $Al_2O_3$, $HfO_2$, $Ta_2O_5$. A patterned metal layer including a metal interconnect is electrically connected with an array of the metal electrodes in the array of compliant transfer heads. The patterned metal layer may also include an array of metal leads electrically connected with the array of metal electrodes.

In an embodiment, the array of compliant transfer heads extend extend from a first side of a support structure, and a second array of compliant transfer heads extend from a second side of the support structure opposite the first side. In an embodiment, each of the compliant transfer heads are deflectable into a cavity within the base substrate. In an embodiment, the array of compliant transfer heads are deflectable into a first cavity in the base substrate, and a second array of compliant transfer heads is deflectable into a second cavity in the base substrate separate from the cavity in the base substrate. The array of compliant transfer heads and second array of compliant transfer heads may also be deflectable into the same cavity in the base substrate.

One or more through vias may extend through the base substrate and in electrical connection with the metal interconnect. An insulating layer may cover a side surface of the through via, and a conductive layer may be formed on the insulting layer covering the size surface of the though via and in electrical connection with the metal interconnect. The conductive layer may not completely fill the through via. In an embodiment, the spring layer is a silicon layer and the lower insulating layer is a silicon oxide layer.

In one implementation compliant bipolar micro device transfer head arrays are described. In an embodiment, a compliant micro device transfer head array includes a base substrate and an array of compliant transfer heads formed over the base substrate and deflectable toward the base substrate. In an embodiment, each compliant micro device transfer head is deflectable into a cavity in the base substrate. Each compliant transfer head may include a lower insulating layer, a spring layer over the lower insulating layer where the spring layer includes a mesa structure protruding from a spring arm, an upper insulating layer over the spring layer, first and second metal electrodes over the upper insulating layer and the mesa structure, where the first and second metal electrodes are electrically isolated from each other, and a dielectric layer covering the first and second metal electrodes over the mesa structure. In an embodiment, the dielectric layer is formed of a high-k dielectric material such as $Al_2O_3$, $HfO_2$, $Ta_2O_5$. A patterned metal layer includes a first metal interconnect is electrically connected with the first array of the metal electrodes in the array of compliant transfer heads, and a second metal interconnect is electrically connected with the second array of the metal electrodes in the array of compliant transfer heads. In an embodiment, the first and second metal interconnects are parallel to one another.

In an embodiment, a first and second through vias extend through the base substrate, and in electrical connection with the first and second interconnects, respectively. An insulating layer may cover side surfaces of the first and second through vias, and a conductive layer may be formed on the insulting layer covering the size surfaces of the though vias and in electrical connection with the first and second metal interconnects, respectively. The first and second conductive layers may not completely fill the first and second through vias. In an embodiment, the spring layer is a silicon layer and the lower insulating layer is a silicon oxide layer.

BRIEF DESCRIPTION OF THE DRAWINGS

FIG. 3A is a cross-sectional side view illustration of a monopolar compliant micro device transfer head array with metal electrodes taken along lines X-X and Y-Y from FIG. 1 in accordance with an embodiment of the invention.

FIG. 3B is a plan view illustration of FIG. 3A taken along lines X-X and Y-Y from FIG. 1 according to an embodiment of the invention.

FIG. 4A is a cross-sectional side view illustration of a bipolar compliant micro device transfer head array with metal electrodes taken along lines X-X and Y-Y from FIG. 2 in accordance with an embodiment of the invention.

FIG. 4B is a plan view illustration of FIG. 4A taken along lines X-X and Y-Y from FIG. 2 according to an embodiment of the invention.

FIGS. 5A-17B are cross-sectional side view and plan view illustrations of a method of forming a bipolar compliant micro device transfer head with metal electrodes of FIGS. 4A-4B in accordance with an embodiment of the invention.

DETAILED DESCRIPTION OF THE INVENTION

Figure 1:
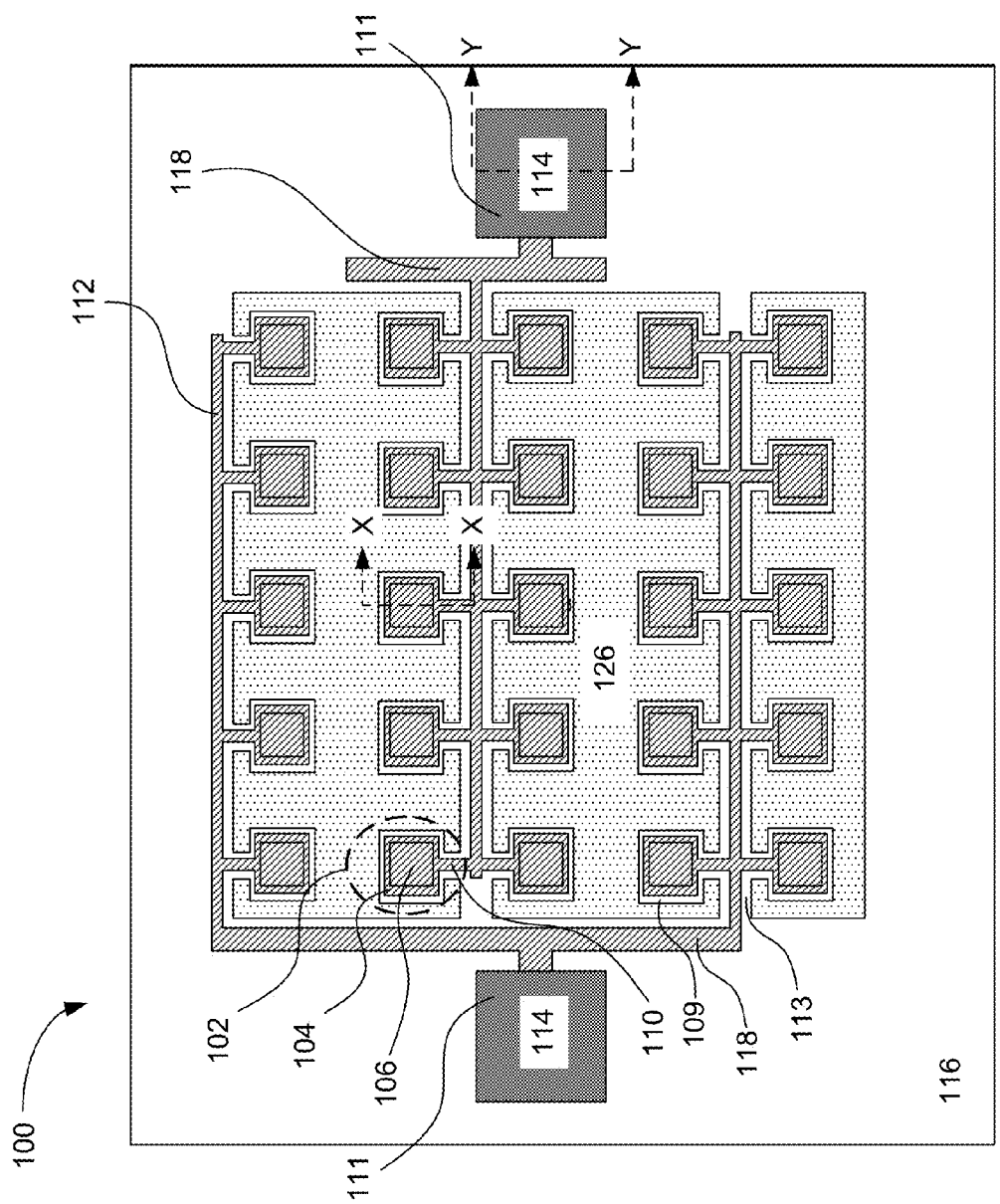
FIG. 1 is a plan view illustration of a monopolar compliant micro device transfer head array with metal electrodes in accordance with an embodiment of the invention.

Embodiments of the present invention describe a compliant micro device transfer head and head array with metal electrodes, and method of transferring a micro device and an array of micro devices to a receiving substrate. For example, the compliant micro device transfer head and head array with metal electrodes may be used to transfer micro devices such as, but not limited to, diodes, LED devices for light-emission, transistors, silicon ICs for logic and memory, gallium arsenide (GaAs) circuits for radio frequency (RF) communications, and MEMS from a carrier substrate to a receiving substrate such as, but is not limited to, a display substrate, a lighting substrate, a substrate with functional devices such as transistors or integrated circuits (ICs), or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

In one aspect, without being limited to a particular theory, embodiments of the invention describe compliant micro device transfer heads and head arrays which operate in accordance with principles of electrostatic grippers, using the attraction of opposite charges to pick up micro devices. In accordance with embodiments of the present invention, a pull-in voltage is applied to a compliant micro device transfer head in order to generate a grip pressure on a micro device and pick up the micro device. In application, the array of compliant micro device transfer heads with metal electrodes receive an applied operating voltage. Due to the high conductivity of metal materials, the applied voltage may be transferred to the metal electrodes with minimized current loss in the metal interconnects and metal leads.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 lam. However, it is to be appreciated that embodiments of the present invention are not necessarily so limited, and that certain aspects of the embodiments may be applicable to larger, and possibly smaller size scales. In an embodiment, a single micro device in an array of micro devices, and a single electrostatic transfer head in an array of electrostatic transfer heads both have a maximum dimension, for example length or width, of 1 to 100 µm. In an embodiment, the top contact surface of each micro device or electrostatic transfer head has a maximum dimension of 1 to 100 µm. In an embodiment, the top contact surface of each micro device or electrostatic transfer head has a maximum dimension of 3 to 20 µm. In an embodiment, a pitch of an array of micro devices, and a pitch of a corresponding array of electrostatic transfer heads is (1 to 100 µm) by (1 to 100 µm), for example a 20 µm by 20 µm, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of compliant micro device transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices.

In one aspect, embodiments of the invention describe a compliant micro device transfer head with metal electrodes and a method of transfer in which an array of the compliant micro device transfer heads enable improved contact with an array of micro devices as compared to an array of non-compliant transfer heads. The array of compliant micro device transfer heads includes an array of compliant transfer heads that are deflectable toward a base substrate. In application, as an array of compliant transfer heads with metal electrodes is lowered onto an array of micro devices, the deflectable compliant transfer heads associated with taller or contaminated micro devices may deflect more than compliant transfer heads associated with shorter micro devices on a carrier substrate. In this manner, the compliant micro device transfer heads can compensate for variations in height of the micro devices. Compensating for height variations can result in reduced compressive forces applied to certain micro devices, leading to protection of the physical integrity of the micro devices and transfer head array. Compensating for height variation scan also assist each compliant transfer head to make contact with each micro device, and ensure that each intended micro device is picked up. Without the compliant nature of the micro device transfer heads an irregular micro device height or a particle on a top surface of a single micro device could prevent the remainder of the transfer heads from making contact with the remainder of the micro devices in the array. As a result, an air gap could be formed between those transfer heads and micro devices. With such an air gap, it is possible that the target applied voltage would not create a sufficient grip pressure to overcome the air gap, resulting in an incomplete pick-up process. The compliant nature of the micro device transfer heads may also allow for fine alignment between the transfer head array and the carrier or receiving substrate, for example, when the array of micro device transfer heads are not completely parallel to the substrate or array of micro devices carried by the substrate.

In another aspect, embodiments of the invention describe a manner of forming an array of compliant micro device transfer heads from a commercially available silicon-on-insulator (SOI) substrate which allows for a processing sequence with minimal processing steps. Processing sequences in accordance with embodiments of the invention may incorporate simultaneous etching or oxidation operations of different features, reducing the number of masks required during processing.

In another aspect, embodiments of the invention describe a transfer head and transfer head array including vias extending through the base substrate from a backside of the base substrate to the topside of the base substrate for connecting the metal electrodes with working circuitry of a transfer head assembly. The processing sequence in accordance with embodiments of the invention also enables passivation of the vias extending through the base substrate with high temperature thermal oxide growth.

Referring now to FIG. 1, a plan view illustration is provided for a compliant monopolar micro device transfer head array with metal electrodes in accordance with an embodiment of the invention. In the particular embodiment illustrated, the cross-hatch shaded regions illustrate an arrangement of metal electrodes and metal interconnects as viewed from the top surface of the micro device transfer head array with metal electrodes. Structures observed within the cross-hatch shaded areas illustrate a mesa structure formation formed below the metal electrodes. In this manner, the plan view illustration of FIG. 1 provides detail regarding structures which are formed in more than one layer.

As illustrated, the compliant monopolar micro device transfer head array with metal electrodes 100 includes an array of compliant transfer heads 102 connected by an arrangement of metal interconnects 112, and metal bus interconnects 118. As illustrated, metal bus interconnects 118 may be formed over silicon layer 116 around a periphery or outside a working area of the transfer head array including the array of transfer heads 102. As illustrated, the metal interconnects 112 may be formed over a silicon support structure 113 around or in the working area of the transfer head array. In an embodiment, each transfer head 102 includes a single metal electrode 104 formed over a mesa structure 106 and optionally a metal electrode lead 110 connected to a metal interconnect 112. The mesa structure 106 is illustrated as a structure formed within the shaded region of the metal electrode 104 to illustrate its alignment with the metal electrode 104 as the mesa structure 106 is located in a layer below the metal electrode 104.

In one embodiment, the metal electrode 104, metal electrode lead 110 for each compliant transfer head 102 is formed over a silicon spring arm 109 that allows the compliant transfer head 102 to deflect into a cavity 126 by providing a degree of spring-like elasticity. In one embodiment, the silicon spring arm 109 extends over the cavity 126 and extends away from the silicon support structure 113 such that the silicon spring arm 109 acts as a spring during deflection of the compliant transfer head 102 into the cavity 226.

In another embodiment, one or more vias 114 may be formed through the backside of the base substrate to the metal layer to make contact with the metal bus interconnects 118 in order to electrically connect the metal electrodes 104 with working circuitry of a transfer head assembly. In the embodiment illustrated in FIG. 1, the metal bus interconnects 118 on the left and right sides of the illustration may be connected to the same voltage sources as supplied from vias 114 such that each metal electrode in the compliant monopolar micro device transfer head array is applied the same voltage during micro device pick up. In another embodiment, metal bus interconnects 118 on the left and right sides are connected to different voltage sources.

Figure 2:
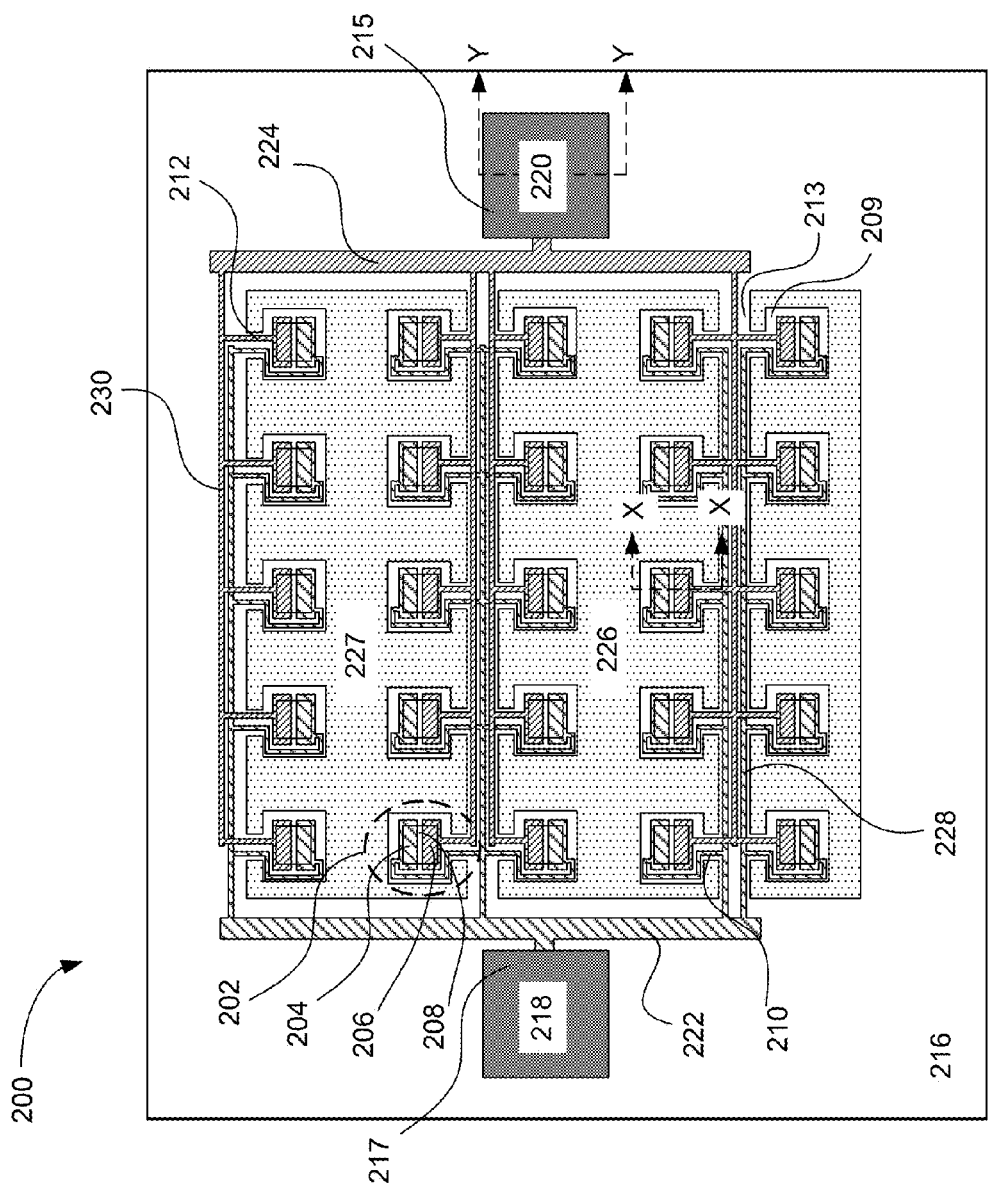
FIG. 2 is a plan view illustration of a bipolar compliant micro device transfer head array with metal electrodes in accordance with an embodiment of the invention.

Referring now to FIG. 2, a plan view illustration is provided for a compliant bipolar micro device transfer head array with metal electrodes in accordance with an embodiment of the invention. In the particular embodiment illustrated, the light cross-hatch shaded areas illustrate an arrangement of metal electrodes and metal interconnects as viewed from the top surface of the micro device transfer head array with respect to the first of the two metal electrodes of the bipolar micro device transfer head array. The dark cross-hatch shaded areas illustrate a second arrangement of metal electrodes and metal interconnects as viewed from the top surface of the micro device transfer head array with respect to the second of the two metal electrodes of the bipolar micro device transfer head array. Structures observed within the cross-hatch areas illustrate a mesa structure formation formed below the two metal electrodes. In this manner, the plan view illustration of FIG. 2 provides detail regarding structures which are formed in more than one layer.

As illustrated, the compliant bipolar micro device transfer head array with metal electrode 200 includes an array of compliant bipolar transfer heads 202 connected by an arrangement of first and second metal interconnects 228, 230 and first and second metal bus interconnects 222, 224. As illustrated, metal bus interconnects 222, 224 may be formed over a silicon layer 216 around a periphery or outside a working area of the transfer head array including the array of compliant transfer heads 202. As illustrated the metal interconnects 228, 230 may be formed over a silicon support structure 213 around or in the working area of the transfer head array. In an embodiment, each compliant bipolar transfer head 202 includes two electrically separated metal electrodes (a first metal electrode 204 and a second metal electrode 206) formed over mesa structure 208 and optionally a first and second metal electrode leads 210 and 212, that are connected to first and second metal interconnects 228 and 230, respectively. In one embodiment, optional first and second metal electrode leads 210 and 212 run parallel to each other. The mesa structure 208 is illustrated as a structure formed within the cross-hatch shaded regions of the first and second metal electrodes 204, 206 to illustrate its alignment with both metal electrodes as the mesa is located in a layer below both metal electrodes.

In one embodiment, the metal electrodes 204 and 206, and metal electrode leads 210 and 212 for each compliant bipolar transfer head 202 are formed over a silicon spring arm 209 that allows the compliant bipolar transfer head 202 to deflect into a cavity 226, 227 by providing a degree of spring-like elasticity. In one embodiment, the silicon spring arm 209 extends over the cavity 226, 227 and extends away from the silicon support structure 213 such that the silicon spring arm 209 acts as a spring during deflection of the compliant bipolar transfer head 202 into the cavity 226, 227.

In one embodiment, the array of compliant micro device transfer heads includes a first and second array of compliant micro device transfer heads. The first array of compliant micro device transfer heads extends away from a support structure 213 in a direction opposite the second array of compliant micro device transfer heads. In one embodiment, first and second arrays of compliant micro device transfer heads deflect into separate cavities. In another embodiment, first and second array of compliant micro device transfer heads deflect into the same cavity. In an embodiment, cavities 226 and 227 represent two separate and adjacent cavities. In another embodiment, cavities 226 and 227 form one cavity. In yet another embodiment, cavities 226 and 227 are a part of a larger cavity where cavities 226 and 227 are merely a section of the larger cavity.

In an embodiment, one or more first vias 218 and second vias 220 may be formed through the backside of the base substrate to the metal layer to make contact with the first metal bus interconnects 222 and the second metal bus interconnects 224, respectively, in order to electrically connect the first and second metal electrodes 204 and 206 with working circuitry of a transfer head assembly. In the embodiment illustrated in FIG. 2, the first metal bus interconnects 222 on the left side and the second metal bus interconnects 224 on the right side of the illustration may be connected to different voltage sources as supplied from first vias 218 and second vias 220, respectively, such that the first and second metal electrodes 204 and 206 are applied separate voltages during micro device pick up. In another embodiment, the first metal bus interconnects 222 and the second metal bus interconnects 225 may be connected to same voltage sources as supplied from first vias 218 and second vias 220, such that the first and second metal electrodes 204 and 206 are applied separate voltages during micro device pick up.

Referring now to FIGS. 3A and 3B, a combination plan view illustration and combination cross-sectional side view are provided taken along lines X-X and Y-Y from FIG. 1. The combination views are not representations of the precise relative location for all of the different features illustrated, rather the combination views combine specific features at different locations in FIG. 1 in a single illustration to more easily represent the processing sequence. For example, while the cross-sectional side view illustration 300 of FIG. 3A shows one via 114 corresponding to one transfer head with metal electrode 102, it is clear from FIG. 1 that one via 114 may be electrically connected with a plurality of transfer heads with metal electrodes 102 along one or more metal interconnects 108. As illustrated, line Y-Y is along backside via 114, and line X-X is along the silicon support structure 113 and the compliant micro device transfer head with metal electrode 102.

Still referring to FIG. 3A, a compliant monopolar transfer head array 100 may include a base substrate 324, and an array of compliant transfer heads 102 formed over the base substrate 324 and deflectable toward the base substrate 324. Each compliant transfer head 102 may include a lower insulating layer 322, and a spring layer over the lower insulating layer, where the spring layer includes a mesa structure 106 protruding from a spring arm 109, where the mesa structure 106 and spring arm 109 are integrally formed. In one embodiment, mesa structure 106 and spring arm 109 are formed from a top silicon layer 116 such that mesa structure 106 and spring arm 109 form one structure. An upper insulating layer 330 may cover the spring arm 109 and a top surface 346 of the mesa structure 106 to avoid electrical drift into the mesa structure 106 from the metal electrode 104. A dielectric layer 332 may cover a top surface of the metal electrode 104 over the mesa structure 106, as well as exposed top surfaces of metal electrode lead 110 and the upper insulating layer 330. In an embodiment, the dielectric layer is formed of a high-k dielectric material such as $Al_2O_3$, $HfO_2$, $Ta_2O_5$. In an embodiment, the high-k dielectric material is deposited with atomic layer deposition (ALD). As used herein the term high-k dielectric material means a dielectric material featuring a dielectric constant greater than 3.9 which is the dielectric constant of $SiO_2$. A patterned metal layer may include the metal electrode 104, metal electrode lead 110, metal interconnects 112, and metal bus interconnects 118. In one embodiment, a cavity 126 is formed underneath the compliant micro device transfer head 102 within the base substrate 324. The spring arm 109 extends over the cavity 126 forming a cantilever beam with a fixed end attached to support layer 113. In one embodiment, a dielectric layer 332 is also formed on the walls of cavity 126.

In an embodiment, one or more via openings 334 extend through the base substrate 324 from a backside 338 of the base substrate 324 to a topside 336 of the base substrate 324 an in electrical connection with the metal interconnect 112. An insulating layer 326 is formed on the backside 338 of the base substrate 324, and an insulating layer 330 is formed on side surfaces within the via openings 334. A conductive layer 328 is further formed on the back surface of the insulating layer 326 and on the insulating layer 330 within the via openings 334. In an embodiment conductive layer 328 does not completely filling the via openings 334. Where base substrate is formed of silicon, the insulating layers 326, 330 insulate electrical shorting through the base substrate 324 between the vias 114.

Referring now to FIGS. 4A and 4B, a combination plan view illustration and combination cross-sectional side view are provided taken along lines X-X and Y-Y from FIG. 2. The combination views are not representations of the precise relative location for all of the different features illustrated, rather the combination views combine specific features at different locations in FIG. 2 in a single illustration to more easily represent the processing sequence. For example, while the cross-sectional side view illustration 400 of FIG. 4A shows one via 220 corresponding to one metal electrode 206, it is clear from FIG. 2 that one via 220 may be electrically connected with a plurality of metal electrodes 206 along one or more metal interconnects 230 Likewise one via 218 may be electrically connected with a plurality of metal electrodes 204 along one or more metal interconnects 228. As illustrated, line Y-Y is along backside via 220, and line X-X is along a silicon support structure 213 and a compliant micro device transfer head 102 with second electrode lead 212, and second and first metal electrodes 206, 204, respectively.

Still referring to FIG. 4A, a compliant bipolar transfer head array 200 may include a base substrate 424, and an array of compliant transfer heads 202 formed over the base substrate 424. Each compliant transfer head 202 may include a lower insulating layer 422 and a spring layer over the lower insulating layer, where the spring layer includes a mesa structure 208 protruding from a spring arm 209, where the mesa structure 208 and spring arm 209 are integrally formed. In one embodiment, mesa structure 208 and spring arm 209 are formed from a top silicon layer 216 such that mesa structure 208 and spring arm 209 form one structure. An upper insulating layer 430 may cover the spring arm 209 and a top surface 446 of the mesa structure 208 to avoid electrical drift into the mesa structure 208 from the metal electrodes 204, 206. First and second metal electrodes 204, 206 are separated by a gap 402. In accordance with an embodiment, electrodes 204, 206 cover the maximum amount of surface area of the top surface upper insulating layer 430 over the top surface 446 of the mesa structure 208 as possible while remaining within patterning tolerances. Minimizing the amount of free space increases the capacitance and resultant grip pressure that can be achieved by the bipolar transfer head. The minimum amount of separation distance may be balanced by considerations for maximizing surface area, while avoiding overlapping electric fields from the electrodes. For example, gap 402 may be 0.5 µm or less, and the minimum separation distance may be limited by the thickness of the electrodes.

A dielectric layer 432 may cover a top surface of the metal electrodes 204, 206 over the mesa structure 208, as well as exposed top surfaces of metal electrode leads 210, 212 and the upper insulating layer 430. In an embodiment, the dielectric layer is formed of a high-k dielectric material such as $Al_2O_3$, $HfO_2$, $Ta_2O_5$. In an embodiment, a high-k dielectric material is deposited with atomic layer deposition (ALD). A patterned metal layer including a metal interconnects 228, 230 is electrically connected with the array of the metal electrodes 204, 206 in the array of compliant transfer heads. The patterned metal layer may also include an array of metal leads 210, 212 electrically connected with the array of metal electrodes 204, 206. In one embodiment, a cavity 226, 227 is formed underneath the compliant micro device transfer heads 202 within the base substrate 324. The spring arms 209 extends over the cavity 226, 227 forming a cantilever beam with a fixed end attached to support layer 213. In one embodiment, a dielectric layer 432 is formed on the walls of cavity 226, 227.

In an embodiment, via openings 434 extend through the base substrate 424 from a backside 438 of the base substrate 424 to a topside 436 of the base substrate 424 an in electrical connection with the metal interconnects 228, 230. An insulating layer 326 is formed on the backside 438 of the base substrate 424, and an insulating layer 430 is formed on side surfaces within the via openings 434. A conductive layer 428 is further formed on the back surface of the insulating layer 426 and on the insulating layer 430 within the via openings 334. In an embodiment conductive layer 428 does not completely filling the via openings 434. Where base substrate is formed of silicon, the insulating layers 426, 430 insulate electrical shorting through the base substrate 424 between the vias 218, 220.

FIGS. 5A-17B illustrate a method of forming a compliant bipolar micro device transfer head with metal electrodes in accordance with an embodiment of the invention. Initially, the processing sequence may begin with commercially available SOI substrate as illustrated in FIGS. 5A-5B. The SOI substrate may include base substrate 424, top silicon device layer 216, a buried oxide layer 422 between the base substrate and the top silicon device layer, and backside passivation layer 426. The buried oxide layer 422 is also referred to as the lower insulating layer and the passivation layer 426 is also referred to as an insulating layer within this disclosure. In an embodiment, base substrate 424 is a (100) silicon handle wafer having a thickness of 500 µm+/−50 µm, buried oxide layer 424 is 1 µm+/−0.1 µm thick, and top silicon device layer is 2-20 µm+/−0.5 µm thick, or more specifically approximately 5 µm. In an embodiment, the backside passivation layer 426 is a thermal oxide having a thickness up to approximately 2 µm thick, which is the approximate upper limit for thermal oxidation of silicon.

A mask layer 602 may then be formed over the top silicon device layer 216, as illustrated in FIGS. 6A-6B. Mask layer 602 may be deposited, or alternatively thermally grown from the top silicon device layer 216. In an embodiment, mask layer 602 is a thermally grown $SiO_2$ layer having a thickness of approximately 0.1 µm. In an embodiment, where mask layer 602 is thermally grown $SiO_2$, the mask layer 602 has a thickness which is significantly less than the thickness of buried oxide ($SiO_2$) layer 422 in order to maintain structural stability for the partially patterned SOI structure during removal of the patterned mask layer.

In an embodiment, backside via openings 434 are then formed in the SOI substrate. Initially, as illustrated in FIGS. 7A-7B, the backside via openings are formed through the backside passivation layer 426 and base substrate 424, stopping on the buried oxide layer 422. In an embodiment, the backside via openings 434 illustrated in FIGS. 7A-7B are formed by applying a patterned positive photoresist on the backside passivation layer 426, followed by etching of the exposed passivation layer 426 and dry reactive ion etching (DRIE) of the base substrate 424, stopping on the buried oxide layer 422. The base substrate 424 may alternatively be etched with a wet etchant such as KOH. However, KOH wet etchant attacks silicon preferentially in the (100) plane, and may produce an anisotropic V-etch. DRIE etching may be selected for more vertical sidewalls in the backside via openings 434. After etching of the base substrate 424 the patterned positive photoresist can be removed by $O_2$ ashing followed by piranha etch resulting in the structure illustrated in FIGS. 7A-7B.

Referring to FIGS. 8A-8B, the mask layer 602 is patterned to form an array of islands 802 which will correspond to the mesa structures of the metal electrodes. In an embodiment, the mask layer is a thermally grown $SiO_2$ layer, and islands 802 are formed by applying a positive photoresist, exposing, and removing undeveloped areas of the photoresists with a potassium hydroxide (KOH) developer solution. The mask layer 602 is then dry etched to form islands 802 using a suitable technique such as ion milling, plasma etching, reactive ion etching (RIE), or reactive ion beam etching (RBIE), electron cyclotron resonance (ECR), or inductively coupled plasma (ICP), stopping on the silicon layer 216. If a high degree of anisotropic etching is not required, a dry plasma etching technique with a plasma etchant such as $CF_4$, $SF_6$, or $NF_3$ may be used. The patterned photoresist is then removed by $O_2$ ashing followed by piranha etch resulting in the structure illustrated in FIGS. 8A-8B. In an embodiment, each island 802 has a maximum dimension, for example length or width, of 1 to 100 µm. In an embodiment, each island has a maximum dimension of 3 to 20 µm. In an embodiment, a pitch between an array of islands 802 is (1 to 100 µm) by (1 to 100 µm), for example a 20 µm by 20 µm, or 5 µm by 5 µm pitch.

Referring to FIGS. 9A-9B, the array of islands 802 is used as a mask layer to form mesa structure 208. The mesa structure 208 may be formed by a timed wet etch with a KOH solution to remove a portion (e.g. 3 µm to 4 µm) of top silicon device layer 216 and leaving a flat layer of remaining top silicon layer 902. In an embodiment, the resulting structure is a top silicon layer 216 that has a flat remaining top silicon portion 902 and a raised mesa structure 208. Because KOH wet etchant displays an etch rate selectivity 400 times greater in the (100) plane than in the (111) plane, it acts as more of an anisotropic etch than an isotropic etch. However, its marginally isotropic etch property creates a slightly oblique (111)-oriented sidewall and a flat (100)-oriented bottom profile to create the slanted sidewalls of mesa structure 208. In an embodiment, a timed buffered-oxide etch (BOE) may then be applied to remove islands 802. In an embodiment, the resulting mesa structure has a maximum width of 1 to 100 µm. In an embodiment, each mesa structure has a maximum dimension of 3 to 20 µm. In an embodiment, a pitch between an array of mesa structures is (1 to 100 µm) by (1 to 100 µm), for example a 20 µm by 20 µm, or 5 µm by 5 µm pitch.

Referring to FIGS. 10A-10B, cavity opening 1002 and contact hole opening 1004 are formed through the remaining top silicon layer 902 above buried oxide layer 422. In an embodiment, contact hole opening 1004 is formed in line with the axis of backside via openings 434, and cavity opening 1002 is formed near the end of the mesa structure that is anticipated to be the free, extending end of the compliant transfer head. Openings 1004 above the first insulating layer 422 and centered along the axis of the underlying backside via openings 434 may be formed in the top silicon layer 216 with a thick patterned positive photoresist, followed by a silicon reactive ion etch (RIE) of the top silicon layer 216 with a chemically reactive plasma. The RIE removes the unprotected areas of the top silicon layer 216 and stops at the top surface of the buried oxide layer 422. The patterned photoresist is then removed by $O_2$ ashing followed by piranha etch resulting in the structure in FIGS. 10A-10B.

Referring to FIGS. 11A-11B, an upper insulating layer 430 may be grown on the top silicon layer 216, mesa structure 208, and remaining top silicon layer 902 by wet thermal oxidation, as well as a passivation layer 430 within the sidewalls of the backside via openings 434. Prior to oxidation, the exposed surfaces of mesa structure 208, top silicon layer 216, remaining top silicon layer 902, and backside via opening sidewalls may be subjected to a pre-oxide clean to remove any contaminants that may prevent or hinder oxide growth on exposed silicon material and to clean the surface for efficient oxide growth. In an embodiment, the resulting thickness from the wet thermal oxidation may be 1 µm thick. The interface 1102 at the edge of the mesa structure 208 and the remaining top silicon layer 902 are the same silicon material, allowing both mesa structure 208 and remaining top silicon layer 902 to oxidize to form a continuous upper insulating layer 430.

Referring now to FIGS. 12A-12B, patterned conductive layer 428 is formed on the passivation layer 426 within the via openings 434 and on the bottom surface of the buried oxide layer 422. In an embodiment, the patterned conductive layer 428 is formed by sputtering through a shadow mask. In another embodiment, the patterned conductive layer 428 includes a first layer of 1000 Å-thick titanium-tungsten (TiW), and a 1 µm to 3 µm thick outer layer of gold (Au).

Referring to FIGS. 13A-13B, first and second metal electrodes 204, 206 and first and second metal electrode leads 210, 212 are formed on a portion of the second insulating layer 430. In an embodiment, a layer of nickel-chromium (NiCr) is first deposited with a thickness of 1000 Å. The layer of NiCr is then patterned by first forming a mask layer over the NiCr and subsequently wet etching the unprotected areas. The mask layer is created by applying a positive photoresist, exposing, and removing undeveloped areas of the photoresist with a KOH developer solution. Because interface between the mesa structure 208 and remaining top silicon layer 902 is continuous, formation of the first and second electrodes 204 and 206 and optional first and second metal electrode leads 210 and 212 are likewise continuous, thereby avoiding potential for electrical discontinuity of the metal electrode at the bottom of the mesa structure 208. In an embodiment, first and second metal interconnects 228, 230 and metal bus interconnects 222, 224 are formed simultaneously with metal electrodes 204, 206 and metal electrode leads 210, 212. It is to be appreciated that while the particular embodiments illustrated and described in FIGS. 13A-13B have been made with regard to a bipolar electrode configuration, in other embodiment a similar processing sequence can be used to form a monopolar electrode configuration. While the following description of FIGS. 14A-17B is made with regard to a bipolar configuration, it is to be appreciated that similar processing sequences may also be used to form a monopolar configuration, in accordance with embodiments of the invention.

Referring to FIGS. 14A-14B, openings 1402 and 1404 are formed through the buried oxide layer 422 within the cavity opening and above patterned conductive layer 428. Openings 1402 above the first insulating layer 422 centered along the axis of the underlying patterned conductive layer 428 may be formed in the first insulating layer 422 with a thick patterned positive photoresist, followed by an anisotropic dry etching of the first insulating layer 422. The patterned photoresist is then removed by $O_2$ ashing followed by piranha etch resulting in the structure in FIGS. 14A-14B.

Referring to FIGS. 15A-15B, patterned conductive layer 215 is formed on a portion of the second insulating layer 430. Prior to metal sputtering, the exposed surfaces of the second insulating layer 430 and top surface of the underlying patterned conductive layer 428 may be subjected to a pre-metal plasma clean to remove any contaminants that may prevent or hinder metal deposition on exposed surfaces. In an embodiment the patterned conductive layer 215 is formed by sputtering NiCr through a shadow mask. In an embodiment, the patterned conductive layer 215 is 1000 Å-thick. In an embodiment, the patterned metal layer 215 makes ohmic contact with the underlying patterned conductive layer 428.

Referring to FIGS. 16A-16B, one or more cavities 226 may then be etched in the base substrate 424 directly underneath the array of compliant transfer heads such that the array of compliant transfer heads are deflectable into the one or more cavities. In an embodiment, a separate cavity 226 is formed directly underneath each compliant transfer head. In an embodiment, a single cavity 226 is formed directly underneath the array of compliant transfer heads. In an embodiment, cavity 226 is formed with a timed release etch into the base substrate 424 which undercuts the spring arm 209 and mesa structure 208. For example, etching may be performed with a fluorine-based chemistry such as $XeF_2$ or $SF_6$. In an embodiment, the one or more cavities 226 are approximately 15 µm deep. In an embodiment, cavity 226 is open to the atmosphere through the cavity opening 1402.

Figure 17B:
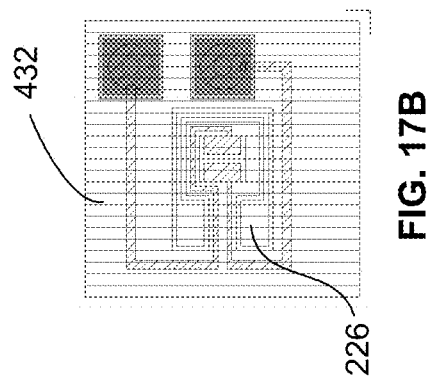
Figure 17A:
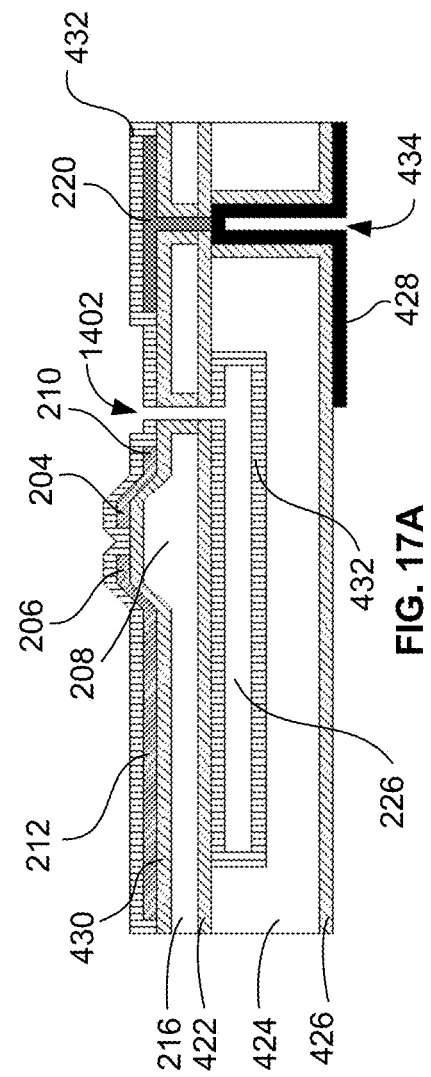

Referring now to FIGS. 17A-17B, the a dielectric layer 432 may be formed on front side of the SOI wafer and the walls within cavity 226 in order to passivate the exposed walls of the base substrate and exposed metal layers including the metal electrodes 204 and 206, and second insulating layer 430. In an embodiment, the dielectric material may be formed of amorphous silicon or PECVD oxide/nitride with a targeted thickness of approximately 5000 Å. The dielectric material may act as a passivation layer to seal the semiconductor structure from moisture and from the outside atmosphere. Furthermore, in accordance with embodiments of the invention, the dielectric layer 432 has a suitable thickness and dielectric constant for achieving the required grip pressure for the micro device transfer head, and sufficient dielectric strength to not break down at the operating voltage. In an embodiment, the dielectric layer is formed of a high-k dielectric material such as $Al_2O_3$, $HfO_2$, $Ta_2O_5$. In an embodiment, a high-k dielectric material is deposited with atomic layer deposition (ALD).

Figure 18:
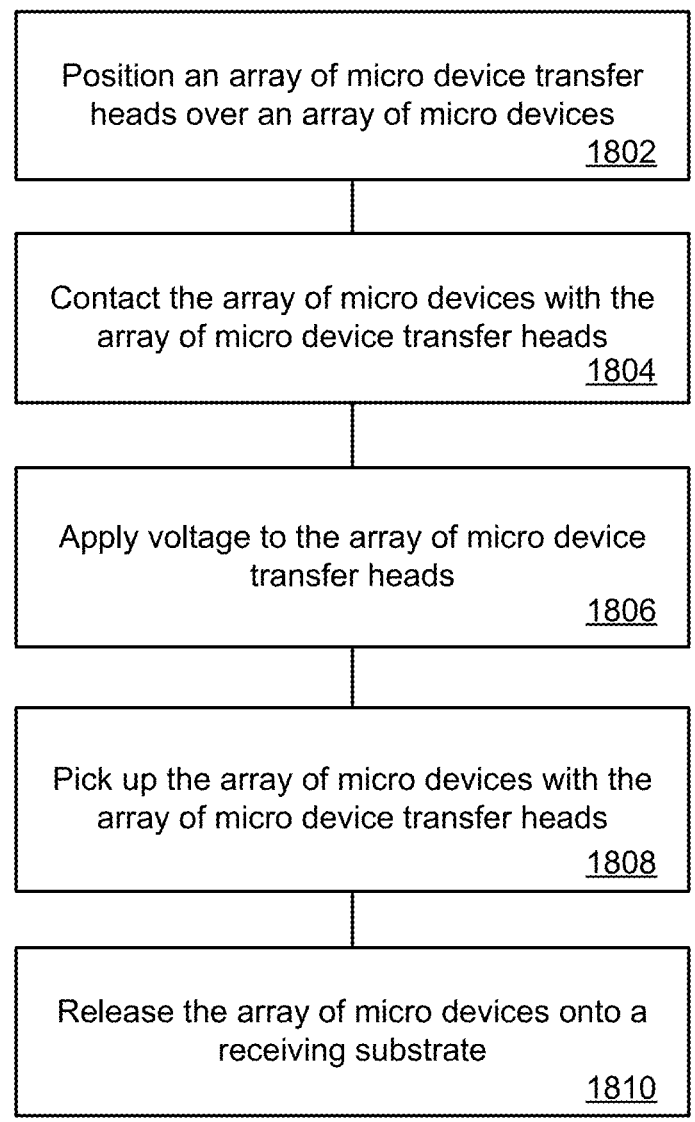
FIG. 18 is a flow chart illustrating a method of picking up and transferring an array of micro devices from a carrier substrate to a receiving substrate in accordance with an embodiment of the invention.

FIG. 18 is a flow chart illustrating a method of picking up and transferring an array of micro devices from a carrier substrate to a receiving substrate in accordance with an embodiment of the invention. At operation 1802 an array of micro device transfer heads with metal electrodes 102 is positioned over an array of micro devices on a carrier substrate. At operation 1804 the array of micro devices are contacted with the array of micro device transfer heads 102. In an alternative embodiment, the array of micro device transfer heads is positioned over the array of micro devices in a suitable air gap separating them which does not significantly affect the grip pressure, for example, 1 nm to 10 nm. At operation 1806 a voltage is applied to the array of transfer heads 102. The voltage may be applied from a transfer head assembly in electrical connection with the array of transfer heads 102 through vias 114. At operation 1808 the array of micro devices is picked up with the array of transfer heads with metal electrodes. At operation 1810 the array of micro devices is then released onto a receiving substrate. For example, the receiving substrate may be, but is not limited to, a display substrate, a lighting substrate, a substrate with functional devices such as transistors or ICs, or a substrate with metal redistribution lines.

While operations 1802-1810 have been illustrated sequentially in FIG. 18, it is to be appreciated that embodiments are not so limited and that additional operations may be performed and certain operations may be performed in a different sequence. For example, in one embodiment, an operation is performed to create a phase change in a bonding layer connecting the micro device to the carrier substrate prior to or while picking up the micro device. For example, the bonding layer may have a liquidus temperature less than 350° C., or more specifically less than 200° C. The bonding layer may be formed of a material which provides adhesion to the carrier substrate, yet also a medium from which the micro device is readily releasable. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly, carrier substrate, and/or receiving substrate.

Furthermore, operation 1806 of applying the voltage to create a grip pressure on the micro devices can be performed in various orders. For example, the voltage can be applied prior to contacting the array of micro devices with the array of micro device transfer heads, while contacting the micro devices with the array of micro device transfer heads, or after contacting the micro devices with the array of micro device transfer heads. The voltage may also be applied prior to, while, or after creating a phase change in the bonding layer.

Where the micro device transfer heads 102 include bipolar metal electrodes, an alternating voltage is applied across the pair of metal electrodes in each micro device transfer head 102 so that at a particular point when a negative voltage is applied to one metal electrode, a positive voltage is applied to the other metal electrode in the pair, and vice versa to create the pick-up pressure. Releasing the micro devices from the micro device transfer heads 102 may be accomplished with a varied of methods including turning off the voltage sources, lowering the voltage across the pair of metal electrodes, changing a waveform of the AC voltage, and grounding the voltage sources. Release may also be accomplished by discharge associated with placing the micro devices on the receiving substrate.

In utilizing the various aspects of this invention, it would become apparent to one skilled in the art that combinations or variations of the above embodiments are possible for forming a bipolar micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A compliant micro device transfer head array structure, comprising:
    a base substrate;
    an array of compliant transfer heads formed directly over the base substrate and deflectable toward the base substrate, each compliant transfer head comprising:
        a cavity into which the compliant transfer head is deflectable;
        a lower insulating layer;
        a spring layer directly over the lower insulating layer, wherein the spring layer includes a mesa structure protruding from a spring arm;
        an upper insulating layer directly over the spring layer;
        a first metal electrode directly over the upper insulating layer and the mesa structure
        a second metal electrode directly over the upper insulating layer and the mesa structure, wherein the first metal electrode and the second metal electrode are electrically isolated from each other; and
        a dielectric layer directly covering the first metal electrode and the second metal electrode directly over the mesa structure;
        a second dielectric layer formed on walls of the cavity; and
    a patterned metal layer including a first metal interconnect electrically connected with the first metal electrode for each said compliant transfer head and a second metal interconnect electrically connected with the second metal electrode for each said compliant transfer head.

2. The compliant micro device transfer head array structure of claim 1, wherein each cavity is completely in the base substrate.

3. The compliant micro device transfer head array structure of claim 1, wherein the first metal interconnect and the second metal interconnect are parallel to one another.

4. The compliant micro device transfer head array structure of claim 1, further comprising a first and second through vias extending through the base substrate, and in electrical connection with the first metal interconnect and the second metal interconnect, respectively.

5. The compliant micro device transfer head array structure of claim 4, further comprising an insulating layer covering a side surface of the first and second through vias.

6. The compliant micro device transfer head array structure of claim 5, further comprising a first and second conductive layers on the passivation layer within the first and second through vias, and in electrical contact with the first metal interconnect and the second metal interconnect, respectively.

7. The compliant micro device transfer head array structure of claim 6, wherein the first and second conductive layers do not completely fill the first and second through vias.

8. The compliant micro device transfer head array structure of claim 1, wherein each cavity is a separate cavity.

9. The compliant micro device transfer head array structure of claim 1, wherein the spring layer is a silicon layer.

10. The compliant micro device transfer head array structure of claim 9, wherein the lower insulating layer is a silicon oxide layer.

11. The compliant micro device transfer head array structure of claim 1, wherein the dielectric layer is formed of a high-k dielectric material.

12. The compliant micro device transfer head array structure of claim 1, wherein the dielectric layer and the second dielectric layer are formed of the same material.

13. The compliant micro device transfer head array structure of claim 1, wherein the mesa structure includes sidewalls.

14. The compliant micro device transfer head array structure of claim 13, wherein the upper insulating layer of each said compliant transfer head is formed on the sidewalls and a top surface corresponding to the mesa structure of said compliant transfer head.

* * * * *